United States Patent [19]
De Loach, Jr. et al.

[11] 3,946,335
[45] Mar. 23, 1976

[54] STABILIZATION CIRCUIT FOR RADIATION EMITTING DIODES

[75] Inventors: Bernard Collins De Loach, Jr., Murray Hill; Mauro DiDomenico, Jr., Basking Ridge, both of N.J.

[73] Assignee: Bell Telephone Laboratories, Incorporated, Murray Hill, N.J.

[22] Filed: Feb. 18, 1975

[21] Appl. No.: 550,774

[52] U.S. Cl..................... 331/94.5 S; 331/94.5 H
[51] Int. Cl.² ............................................ H01S 3/13
[58] Field of Search..................... 331/94.5; 330/4.3

[56] References Cited
OTHER PUBLICATIONS

Ueno et al., Color TV Transmission Using Light Emitting Diode. NEC Res. and Devel. No. 35 (Oct. 1974), pp. 15–20.

*Primary Examiner*—William L. Sikes
*Attorney, Agent, or Firm*—S. Sherman

[57] ABSTRACT

A particularly important factor limiting the reliability of diode lasers is the catastrophic mirror damage which occurs when the radiated output exceeds a critical value. Experience has shown that this occurs as a result of fluctuations in the drive current, especially in high efficiency diodes. To avoid such damage, a portion of the output radiation from a diode laser, located in the collector circuit of a common emitter drive transistor, is coupled back to a photodetector, located in the base-emitter circuit of the transistor. The resulting negative feedback tends to stabilize the overall operation of the device and maintain the maximum radiated power within safe limits.

4 Claims, 3 Drawing Figures

STABILIZATION CIRCUIT FOR RADIATION EMITTING DIODES

This invention relates to arrangements for stabilizing the power output from a diode laser.

BACKGROUND OF THE INVENTION

The output power from a diode laser is known to vary as a function of temperature, natural aging, and drive current. As materials and fabrication techniques have improved, aging has become less of a problem. Temperature variations can be handled either by placing the laser in a controlled environment (oven or refrigerator), or by programming the drive source to correct for temperature variations. This type of control, however, will either require individual adjustment or extremely tight tolerances on design parameters which, in turn, will lead to reduced yield and higher cost.

The third factor referred to hereinabove, i.e., drive current, is particularly important because of the ease with which catastrophic mirror damage occurs in diode lasers when the radiation output power exceeds the critical value. This can occur as a result of spurious fluctuations in the drive current which, in the more efficient diodes, need not be very big.

It is, accordingly, the broad object of the present invention to stabilize the output power from diode lasers.

SUMMARY OF THE INVENTION

In accordance with one embodiment of the present invention, the output power from a diode laser is stabilized by means of a fast acting negative feedback circuit comprising: a photodetector; and a drive transistor connected in the common emitter configuration. A portion of the output energy radiated by the laser, which is located in the transistor collector circuit, is coupled back to the photodetector, which is located in the transistor base circuit. Photocurrent generated in the photodetector by the incident laser radiation reduces the base input current, thus providing the negative feedback.

It is shown that the total laser output in such an arrangement is independent of the laser slope efficiency to first order. The feedback control circuit thereby provides substantial immunity from changes in this parameter either from device to device, or from within the same device.

It is further shown that the sensitivity of the laser output to changes in the threshold current, the drive current, and the drive transistor current gain is greatly reduced. All of these improvements tend to stabilize the overall operation of the device and minimize the opportunity for catastrophic mirror damage.

It is an advantage of the present invention that the feedback circuit is sufficiently fast acting to be capable of responding on a pulse-by-pulse basis in a digital system.

These and other objects and advantages, the nature of the present invention, and its various features, will appear more fully upon consideration of the various illustrative embodiments now to be described in detail in connection with the accompanying drawings.

BRIEF DESCRIPTION

DETAILED DESCRIPTION

Figure 1:
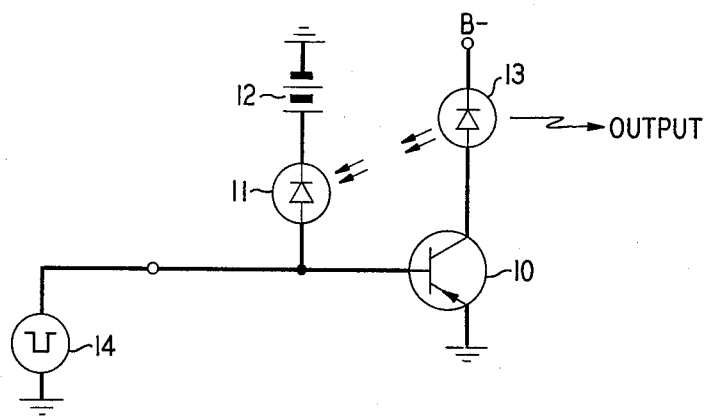
FIG. 1 shows a first embodiment of a diode laser drive circuit with feedback in accordance with the present invention.

Referring to the drawings, FIG. 1 shows a laser output stabilization circuit in accordance with one embodiment of the present invention. Basically, the circuit includes a drive transistor 10, connected in the common emitter configuration, and a photodetector 11. The latter, which is back-biased by means of a direct current voltage source 12, is connected between the base electrode and the emitter electrode of transistor 10.

The diode laser 13 is connected between the collector electrode and the emitter electrode of transistor 10. Means, not specifically shown, are provided for coupling a portion of the laser output power onto the photodetector. This radiation feedback can be done by means of totally and partially reflecting mirrors which deflect a portion of the output power back towards detector 11, or by making both laser cavity mirrors partially transmissive, and using the output from one of the two laser mirrors as the useful output, and the output from the other laser mirror as the feedback signal.

A driver signal source 14 is connected between the base and emitter electrodes of transistor 10.

In the absence of an input signal from driver source 14, there is no output signal from laser 13 and the feedback loop between laser 13 and photodetector 11 is open. When the drive signal is applied, the loop remains open until the collector current exceeds the laser threshold current $I_T$, at which point the laser turns on, and the photodetector is illuminated.

Figure 2:
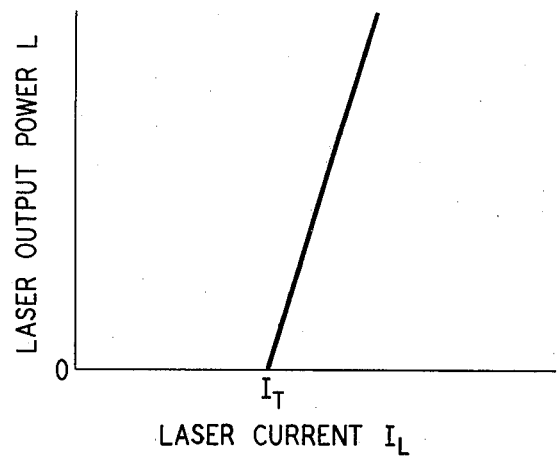
FIG. 2 shows a typical diode laser output power -vs- input current characteristic.

In order to analyze the circuit operation, several simplifying assumptions will be made. First, the relationship between the laser power output and the laser injection current, illustrated graphically in FIG. 2, is approximated by $$L = 0 \text{ for } I_L \leq I_T \tag{1}$$

and $$L = n(I_L - I_T) \text{ for } I_L \geq I_T, \tag{2}$$

where

L is the total laser output power;
$I_T$ is the laser threshold current;
$I_L$ is the laser current;
and
n is a constant called the differential slope efficiency.

The reverse bias on the photodetector is made high enough so that the detector appears essentially as an open circuit to the driver source, which itself has a high output impedance. When illuminated, however, the photodetector becomes a current source whose current $I_{pc}$ is related to the incident illumination $L_{pc}$ by $$I_{pc} = KL_{pc}, \tag{3}$$

where

K is the photodetector efficiency constant.

The photodetector only produces current when it is illuminated and, hence, only when transistor 10 is "on." In this "on" condition, the forward biased base-emitter junction of the transistor presents a low impedance to the detector and essentially all of photodetector current flows through this junction. The net base current $I_b$ is, therefore, $$I_b = I_d - I_{pc}, \quad (4)$$

where $I_d$ is the drive source current.

Designating the transistor current gain as $\beta$, the laser current $I_L$, which in the embodiment of FIG. 1 is equal to the collector current $I_c$, is given by $$I_L \equiv I_c = \beta(I_d - I_{pc}). \quad (5)$$

Designating the fraction of the total laser output intercepted by the photodetector as, $f$, we derive from equations (3) and (4) that $$I_L = \beta[I_d - fKn(I_L - I_T)]. \quad (6)$$

Solving for $I_L$ yields $$I_L = \frac{\beta(I_d + fKn\,I_T)}{(1 + \beta fKn)}. \quad (7)$$

Assuming that one-half the total output power is used in the feedback loop, i.e., $f = \frac{1}{2}$, and using typical values for K, $\beta$, $n$, of K = 0.5 mA/mW, $\beta$ = 100 and $n$ = 0.6 mW/mA, the term $fK\beta n$ in the denominator is approximately equal to 16. Being much greater than unity, the one in the denominator can be neglected, in which case equation (7) reduces to $$I_L \approx I_T + I_d/fKn. \quad (8)$$

Substituting equation (7) for $I_L$ in equation (2), and making the same approximation as in equation (8), we obtain for the total laser output power $$L \approx \frac{1}{\beta fK}[\beta I_d - I_T]. \quad (9)$$

The first thing to note in equation (9) is that the laser output power is to a first order approximation independent of the laser slope efficiency $n$. The feedback circuit thus provides substantial immunity from changes in this parameter either from laser to laser, or from within a given laser.

More accurately, the total laser output power is given by $$L = \frac{n(\beta I_d - I_T)}{1 + \beta fKn}. \quad (10)$$

Using this more accurate expression, we find that the sensitivity of the laser output power to changes in n with feedback is given by $$\frac{\Delta L}{\Delta n} = \frac{(\beta I_d - I_T)}{(\beta fKn)^2}, \quad (11)$$

whereas without feedback it is $$\frac{\Delta L}{\Delta n} = (\beta I_d - I_T), \quad (12)$$

which is larger by the factor $(\beta fKn)^2 \gg 1$.

Secondly, it is noted that the sensitivity of the laser output to changes in the laser threshold current, to changes in the drive current, and to changes in the transistor current gain is, in each case, significantly reduced. For example:

a. The ratios of the changes in output power, $\Delta L$, to the change in threshold current, $\Delta I_T$, are given by $$\frac{\Delta L}{\Delta I_T} = -\frac{1}{\beta fK} \text{(With feedback)} \quad (13)$$

and $$\frac{\Delta L}{\Delta I_T} = -n \text{ (Without feedback)}. \quad (14)$$

For the parameters given hereinabove, these ratios are $-4 \times 10^{-2}$ mW/mA and $-60 \times 10^{-2}$ mW/mA, respectively, corresponding to a fifteen fold improvement.

b. The ratios of the change in output power, $\Delta L$, to the change in drive current, $\Delta I_d$, are given by $$\frac{\Delta L}{\Delta I_d} = \frac{1}{fK} \text{(With feedback)} \quad (15)$$

and $$\frac{\Delta L}{\Delta I_d} = n\beta \text{ (Without feedback)}. \quad (16)$$

For the same numerical values, these ratios are 4 mW/mA and 60 mW/mA, respectively, thus showing a similar fifteen fold reduction.

c. The sensitivities of the laser output to changes in the transistor gain are given by $$\frac{\Delta L}{\Delta \beta} = \frac{I_T}{fK\beta^2} \text{(With feedback)} \quad (17)$$

and $$\frac{\Delta L}{\Delta \beta} = nI_d \text{ (Without Feedback)}. \quad (18)$$

For a laser with a threshold current of 100 mA, nominally operation 10 percent above threshold, we obtain for $I_d$ without feedback 1.1 mA, and for equations (14) and (15) values for $\Delta L/\Delta \beta$ of 0.04 mW and 0.66 mW, respectively. Thus, with feedback the sensitivity of the output power to changes in $\beta$ is reduced by a factor of approximately 16.

Expressed in terms of the drive current, the output power from the laser is given by $$L = n\beta(I_d - I_T/\beta) \text{ Without feedback)} \quad (19)$$

and $$L = (1/fK)(I'_d - I_T/\beta) \text{ (With feedback)}. \quad (20)$$

To get the same output power with and without feedback, we equate equations (19) and (20) and obtain $$I'_d = n\beta fKI_d - (n\beta fK-1)(I_T/\beta). \quad (21)$$

For the conditions specified above, we find that $I'_d = 2.5$ mA, or that for the same output, the drive current with feedback is 2.27 times the drive current without feedback ($I_d = 1.1$ mA). However, what is more significant is the reduced sensitivity of the laser output to changes in driver current and other circuit parameters.

Figure 3:
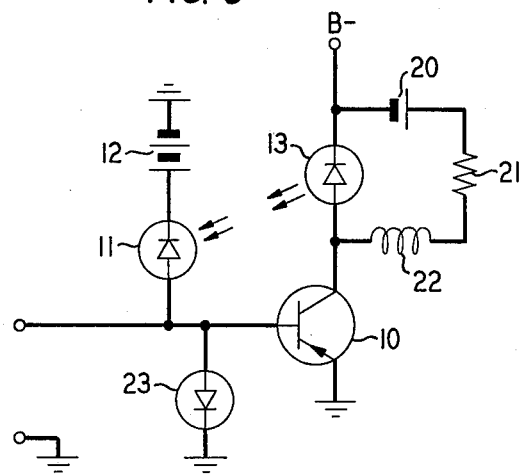
FIG. 3 shows a second embodiment of the invention.

FIG. 3 shows the embodiment of FIG. 1, modified to take into account two matters of practical consideration. While both matters are taken into account in the illustrative embodiment, the inclusion of either one or the other, or both modifications in any specific case will, of course, depend upon the particular application.

The first of these modifications is a prebiasing circuit comprising a direct current voltage source 20, a resistor 21 and a r.f. choke 22. The prebiasing circuit is connected across laser diode 13 and serves to maintain a minimum bias current $I_o$ flowing through the diode. The prebias current, which is less than the threshold current, is provided so as to reduce the laser turn-on time.

Also included in the embodiment of FIG. 3 is a second diode 23, such as a Schottky barrier diode, connected across the base-emitter junction of transistor 10. This diode is included to prevent reverse-bias breakdown of the base-emitter junction. It will be noted that both photodetector 11 and the base-emitter junction of transistor 10 are reverse-biased by direct current voltage source 12. The latter can be as large as 100 volts or greater, which voltage will be divided between the photodetector and the base-emitter junction. To avoid having too large a reverse-bias voltage develop across the latter, diode 23, poled in the forward-bias direction, is connected across the base-emitter junction. This clamps the reverse-bias voltage across the junction at some well-defined, low value. Alternatively, a resistor can be used instead of a diode. The base-emitter voltage in this second case will be determined by the leakage current through the photodetector and the magnitude of the added resistor. If the output impedance of the signal source dividing transistor 10 is low enough, it will effectively clamp the base-emitter, junction voltage at a safe, low value, in which case no separate resistor need be added.

The operation of the embodiment of FIG. 3 is substantially the same as described in connection with FIG. 1 except that the equations (7), (8) and (9) are now given by $$I_L = \frac{\beta(I_d + fKnI_T) + I_o}{(1 + \beta fKn)}, \quad (22)$$

$$I_L \approx I_T + \frac{I_d}{fKn} + \frac{I_o}{\beta fKn} \quad (23)$$

and $$L \approx \frac{1}{\beta fK}[\beta I_d - (I_T - I_o)], \quad (24)$$

respectively.

The sensitivity equations are unaffected except for equation (17) wherein $(I_T-I_o)$ is substituted for $I_T$.

One assumption implicit in the previous analysis is the timely application of the feedback (i.e., photodetector) current to the base of the transistor. This implies that the total loop delay is at least equal to or faster than the rate at which the output power builds up in the laser diode.

The required rapid response is achieved, in accordance with the present invention, by locating the photodetector in the base-emitter circuit of the laser drive transistor. In addition, one would advantageously use a fast responding photodetector, and might also shape the drive current pulse to further control the power build up in the laser.

Thus, in all cases it is understood that the above-described arrangements are illustrative of only a small number of the many possible specific embodiments which can represent applications of the principles of the invention. Numerous and varied other arrangements can readily be devised in accordance with these principles by those skilled in the art without departing from the spirit and scope of the invention.

What is claimed is:
1. The combination comprising:
   a transistor connected in the common emitter configuration;
   a radiation emitting diode laser coupled between the collector and emitter electrodes of said transistor;
   a photodetector coupled between the base and emitter electrodes of said transistor;
   means for coupling a portion of the radiated output power from said diode to said photodetector;
   and means for coupling an input signal between said base and emitter electrodes.
2. The combination according to claim 1 wherein said photodetector is a back-biased photodiode.
3. The combination according to claim 1 including means for limiting the bias developed across the transistor base-emitter junction.
4. The combination according to claim 1 including means for prebiasing said diode.

* * * * *

UNITED STATES PATENT AND TRADEMARK OFFICE
CERTIFICATE OF CORRECTION

PATENT NO. : 3,946,335
DATED : March 23, 1976
INVENTOR(S) : Bernard C. De Loach, Jr. and Mauro Di Domenico, Jr.

It is certified that error appears in the above-identified patent and that said Letters Patent are hereby corrected as shown below:

Column 4, line 12, change "changes" to --change--.

Column 5, line 45, change "dividing" to --driving--.

Signed and Sealed this twenty-ninth Day of June 1976

[SEAL]

Attest:

RUTH C. MASON
*Attesting Officer*

C. MARSHALL DANN
*Commissioner of Patents and Trademarks*